United States Patent [19]

Tihanyi et al.

[11] 3,897,625

[45] Aug. 5, 1975

[54] METHOD FOR THE PRODUCTION OF FIELD EFFECT TRANSISTORS BY THE APPLICATION OF SELECTIVE GETTERING

[75] Inventors: Jenö Tihanyi, Neuried; Heinrich Schloetterer, Putzbrunn-Solalinden, both of Germany

[73] Assignee: Siemens Aktiengesellschaft, Berlin & Munich, Germany

[22] Filed: Mar. 28, 1974

[21] Appl. No.: 455,589

[30] Foreign Application Priority Data

Mar. 30, 1973 Germany ............................ 2316118

[52] U.S. Cl. ..................... 29/571; 29/578; 148/191; 357/23

[51] Int. Cl. ............................................... B01j 17/00

[58] Field of Search ............... 29/571, 578; 148/191

[56] References Cited

UNITED STATES PATENTS

| | | | |
|---|---|---|---|
| 3,490,964 | 1/1970 | Wheeler | 148/191 |
| 3,783,052 | 1/1974 | Fisher | 148/191 |
| 3,837,071 | 9/1974 | Roven | 29/571 |

OTHER PUBLICATIONS

RCA–Technical Notes, TN No. 891, Greig & Jackson, June 21, 1971.

IBM Technical Disclosure Bulletin, Vol. 11, No. 4, Sept. 1968, p. 397, Statz.

*Primary Examiner*—W. Tupman

*Attorney, Agent, or Firm*—Hill, Gross, Simpson, Van Santen, Steadman, Chiara & Simpson

[57] ABSTRACT

Method of making a field effect transistor having a short channel length which includes forming a protective covering layer on a silicon layer medium doped with an impurity that can be gettered, removing portions of the protective layer, forming a gettering layer on the exposed silicon surface where the portions of the protective covering has been removed, etching spaced areas of the getter layer and a portion of the protective covering adjacent one of the etched getter areas to provide source and drain diffusion windows, diffusing impurities of the opposite impurity type to the doping of the silicon layer through the windows to provide source and drain regions in the silicon layer separated by a channel region formed in its length in part by a medium doped region and in part by a low doped region, removing the protective covering from above the medium doped region, forming an insulating layer over the entire area, forming windows in the insulating layer above portions of the insulating layer above the source and drain regions, forming electrodes on the source and drain regions respectively and forming a gate electrode on the insulating layer above the highly doped channel region.

15 Claims, 8 Drawing Figures

METHOD FOR THE PRODUCTION OF FIELD EFFECT TRANSISTORS BY THE APPLICATION OF SELECTIVE GETTERING

BACKGROUND OF THE INVENTION

The invention refers to a method for the production of field effect transistors with a channel range of short channel length.

Means have been disclosed in the past by means of which field effect transistors are produced by double diffusion. Such a method is described in an article entitled "Double-Diffused MOS Transistor Achieves Microwave Gain", in Electronics, Feb. 15, 1971, page 99. In the field effect transistor there described, the channel length may be very short and the drain over-lapping capacity very small. In such known field effect transistors the doping of the channel area results as the difference of the diffused impurities. It is therefore very difficult to adjust the threshold voltage and also the channel length of the transistors in a reproducible manner.

It is an object of the present invention to provide a method for the production of a field effect transistor with short channel length whereby the short channel area is produced by only one single diffusion process.

BRIEF SUMMARY OF THE INVENTION

The present invention provides a novel method for the production of field effect transistors by the application of selective gettering which includes coating a substrate with a layer of silicon which is doped during the coating process with a material which can be subjected to the getter process in a later method step. A protective layer is applied on the surface of the silicon layer which is preferably pyrolytically deposited silicon nitride. Portions of the protective layer are selectively etched away leaving exposed areas of the silicon layer. A getter layer formed for example, of thermic silicon oxide, is then applied to the exposed areas. An additional getter treatment may take place by annealing. The regions below the getter layer become regions of low doping.

By means of generally known photolithographic method steps with the simultaneous shortening of the covering, openings are etched in the getter layer, whereby next to the shortened covering, a part of the getter layer remains, and in that the partial areas located under the openings impurities are diffused by a diffusion step. The shortened covering leads to a shortened channel length. In a further method step the covering is removed. An insulating layer than is applied. In a further method step, openings are etched into the insulating layer above the partial areas and onto these openings and onto the insulating layer above the channel area electrically conductive layers are applied.

An essential advantage of the method according to the invention lies in the fact that the disadvantages of double diffusion are eliminated in the production of field effect transistors and in the fact that the transistor structure is produced with a short channel length by a single diffusion and by the use of a special selective getter process.

A further advantage results from the fact that for the production of a shorter channel length, of for instance 3 $\mu$m a rougher mask of for instance 8 to 10 $\mu$m may be used, since the entire length of the channel area and the width of the adjacent areas of low doping are determined by a common mask. This advantage remains even in an improvement of the mask technique in view of finer structures.

A further advantage of the gettering process of the invention lies in the fact that the low doped area next to the channel area provides a field effect transistor that can be operated with higher voltages.

DESCRIPTION OF THE PREFERRED EMBODIMENT

In the FIGS. 1 to 8, the individual method steps for the production of field effect transistors according to the invention are illustrated.

A semiconductor material, for instance, silicon, is doped with a impurity which by the application of a getter layer, for instance consisting of silicon oxide, can be gettered. A mask is applied over predetermined areas which protects parts of the silicon surface from the getter process. By means of the planar technique, areas of different doping can be created under the silicon surface. The gettering is based on the different distribution coefficient for impurities in silicon and silicon oxide.

Referring now to FIGS. 1 to 8, an electrically insulating substrate 1 has applied thereto a semiconductor layer 2. This substrate preferably consists of spinel, for instance of MgAl spinel, or sapphire. As the silicon layer 2 is applied, it is doped with a material which can be subjected to the getter process in a later method step.

Figure 1:
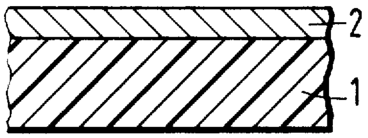
FIGS. 1 to 8 of the drawings, in fragmentary sectional views, schematically illustrate successive steps of a preferred embodiment of the present invention.
Figure 2:
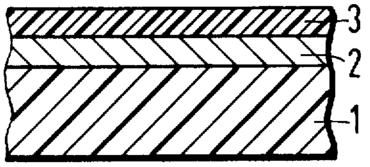
Figure 3:
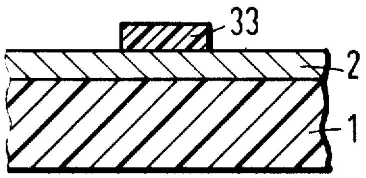
Figure 4:
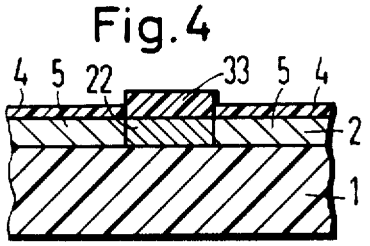

As illustrated in FIG. 2, a layer 3 is applied which protects all areas of the layer 2 located thereunder from the getter process. The layer 3 preferably consists of pyrolytically deposited silicon nitride.

Portions of the layer 3 are then etched away leaving the desired covering 33. Only those areas of the layer 2 are protected from gettering which are located below the covering 33.

Figure 5:
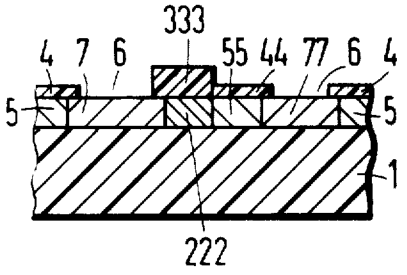
Figure 6:
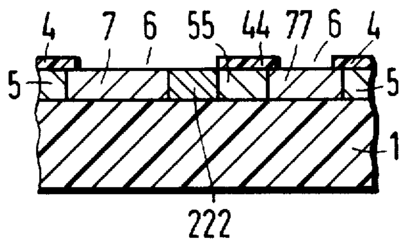

The getter layer 4 is applied onto all accessible surface areas of layer 2 which are not covered by the covering 33. This getter layer preferably consists of thermic silicon oxide, whereby during the oxide production gettering takes place. There may also be an additional getter treatment, for instance, by subsequent annealing. By means of the thermal treatment, impurities are gettered from areas 5 of the silicon layer which are located under the getter layer 4 whereby the doping of these areas 5 which are located under the getter layer 4, is decreased. An area 22 is arranged under the covering 33 which has the same doping as the original layer 2. By using a mask, as is illustrated in FIG. 5, openings 6 are etched into the getter layer 4 in generally known photolithographic method steps, whereby a part 44 of the getter layer remains intact next to the covering 33. Since the edge of the mask is shifted towards the part 44, a shortening of the covering is carried out with the same mask. The shortened covering is denoted by numeral 333. In a further method step, the areas 7 and 77 are produced by diffusion through the openings 6. Thereby the diffused area 7 constitutes the source area, and the diffused area 77 the drain area, of the field effect transistor. The effective channel zone of the transistor includes the area 222. The area 55 having a low doping is located between this area 222 and the drain area 77 below the part 44 of the getter area.

Figure 7:
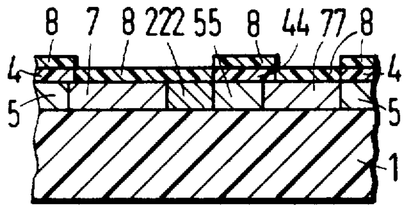
Figure 8:
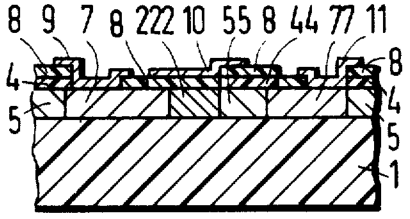

The structure 333 (shown in FIG. 5) is now removed (FIG. 6) in further method steps. As is illustrated in FIG. 7, the insulating layer 8 is now applied on the remaining arrangement. This takes place for instance by thermal oxidation. Above the channel area this layer constitutes the gate insulator.

Openings for the production of contacts are created in generally known method steps in the electrical insulating layer 8 above the areas 7 or 77, respectively. In these openings for the creation of a contact the metal paths 9 and 11 respectively are applied which preferably consist of metal, for instance aluminum. Preferably, in the same method step, above the area 222 the metal electrode 10, which preferably also consists of aluminum, is formed on the electrical insulating layer 8. An over-lapping of the electrode 10 over the area 55, due to the greater distance of the layer 8 from the surface of area 55 does not cause disturbing parasitic capacities and the extent of the over-lapping is not critical. In the arrangement illustrated in FIG. 8, the conductive layer 9 constitutes the source electrode, the conductive electrode 10, the gate electrode and the conductive layer 11 constitutes the drain electrode of a field effect transistor which has been produced according to the inventive method.

The material for the gate electrode may also be, for instance, molybdenum or polycrystalline silicon.

The impurities which are to be removed by means of the getter process may be, for instance, boron or aluminum, which has been introduced into the semiconductor layer 2.

Preferably, the dopant may be aluminum in case of a silicon layer on spinel or sapphire which reaches from the substrate during the production of the epitaxial silicon layer into the layer 2.

The method of selective gettering according to the invention can also be used for the production of field effect transistors of bulk silicon or also for the production of field effect transistors wherein a silicon layer is deposited epitaxially on a silicon substrate.

The thermal oxidation of bulk silicon with a boron concentration of $6 \times 10^{15}$ $cm^{-3}$ at a temperature of approximately 960°C leads for instance to a decreasing of the surface concentration to a value of less than $10^{15}$ $cm^{-3}$. After approximately 15 hours, the concentration has decreased in 0.5 $\mu$m depth to approximately $4 \times 10^{15}$ $cm^{-3}$.

In case of a silicon layer on sapphire with an Al concentration of approximately $10^{17}$ $cm^{-3}$ an oxidation in humid oxygen leads at approximately 1100°C in approximately 1 hour to the fact that the aluminum impurity is almost completely removed.

It will be apparent to those skilled in the art that many variations and modifications may be effected without departing from the spirit and scope of the novel concepts of the present invention.

We claim as our invention:

1. A process for making a field effect transistor having a short channel length which includes providing a layer of silicon doped with an impurity which can be gettered, coating the surface thereof with a protective covering, etching selected portions of the protective covering away to leave certain exposed areas, covering the exposed areas with a layer of gettering material, thereby gettering the region below the gettering layer to reduce the doping concentration in such regions, removing portions of the gettering layer above the spaced low dopant regions while leaving a portion of the remaining protective covering and a portion of the gettering layer lying immediately adjacent the remaining protective covering, diffusing a dopant of the opposite impurity type into the said low dopant regions to form source and drain regions respectively, removing the remaining protective covering while leaving the remaining gettering layer, covering the source and drain regions, the high doped region and the remaining gettering layer with an insulating layer, forming electrodes through said insulating layer to said source and drain regions, and forming a gate electrode on said insulating layer above medium doped region between said source and drain regions.

2. A process according to claim 1, in which the silicon layer is a piece of bulk silicon.

3. A process according to claim 1, in which the layer of silicon is a layer which has been epitaxially grown on a silicon substrate.

4. A process according to claim 1, in which the silicon layer is formed on an electrically insulating substrate.

5. A process according to claim 4, in which the insulating substrate is spinel.

6. A process according to claim 4, in which the insulating substrate is sapphire.

7. A process according to claim 1, in which the gettering layer is a pyrolytically deposited silicon nitride layer.

8. A process according to claim 1, in which the gettering layer is a layer of thermic silicon oxide.

9. A process according to claim 1, in which the electrodes are formed of aluminum.

10. A process according to claim 1, in which the electrodes are formed of molybdenum.

11. A process according to claim 1, in which the electrodes are formed of highly doped polycrystalline silicon.

12. A process according to claim 1, in which the impurity in the silicon layer is boron.

13. A process according to claim 1, in which the impurity in the silicon layer is aluminum.

14. A process according to claim 3, in which the impurity is aluminum, and in which these impurities are diffused from the substrate into the silicon layer during the application of the silicon layer on the substrate.

15. A process according to claim 4, in which the impurity is aluminum, and in which these impurities are diffused from the substrate into the silicon layer during the application of the silicon layer on the substrate.

* * * * *